United States Patent
Kubota et al.

(10) Patent No.: US 7,612,490 B2
(45) Date of Patent: Nov. 3, 2009

(54) PLASMA DISPLAY APPARATUS WITH OPTICAL FILTER AND ELASTIC CONDUCTIVE BODY

(75) Inventors: Hidenao Kubota, Yokohama (JP); Yutaka Yamada, Yokohama (JP)

(73) Assignee: Hitachi, Ltd., Tokyo (JP)

(*) Notice: Subject to any disclaimer, the term of this patent is extended or adjusted under 35 U.S.C. 154(b) by 471 days.

(21) Appl. No.: 11/515,822

(22) Filed: Sep. 6, 2006

(65) Prior Publication Data
US 2007/0182298 A1  Aug. 9, 2007

(30) Foreign Application Priority Data
Feb. 3, 2006 (JP) ............... 2006-026495

(51) Int. Cl.
*H01J 5/16* (2006.01)
(52) U.S. Cl. ............... 313/112; 313/582
(58) Field of Classification Search ........ 313/112, 313/582; 345/37, 41, 60
See application file for complete search history.

(56) References Cited

U.S. PATENT DOCUMENTS 6,316,110 B1 * 11/2001 Anzaki et al. ............ 428/432
2004/0070867 A1 * 4/2004 Kudo et al. ............ 360/97.01
2004/0090182 A1 * 5/2004 Cha ............ 313/582

FOREIGN PATENT DOCUMENTS

| JP | 2004-045778 | 2/2004 |
|---|---|---|
| JP | 2004-170624 | 6/2004 |
| JP | 2004-221565 | 8/2004 |

* cited by examiner

*Primary Examiner*—Nimeshkumar D. Patel
*Assistant Examiner*—Peter R Haderlein
(74) *Attorney, Agent, or Firm*—Antonelli, Terry, Stout & Kraus, LLP.

(57) ABSTRACT

A plasma display apparatus includes a conductive rear surface cover covering a rear surface of a plasma display panel; an optical filter provided with a conductive layer having a surface resistance of 0.5 Ω/square or above, which is disposed at the front surface of the plasma display panel and serves to reduce leakage of electromagnetic waves from the plasma display panel; an optical filter fixing member electrically connected with the rear surface cover, for at least retaining the optical filter; and a conductive body having elasticity, which is interposed between the optical filter and the optical filter fixing member. A plurality of bosses are formed in the optical filter fixing member. A part of the elastic conductive body is compressed by the bosses and connection resistance with the elastic conductive body is reduced.

5 Claims, 5 Drawing Sheets

Before installation of gasket

After installation of gasket

PLASMA DISPLAY APPARATUS WITH OPTICAL FILTER AND ELASTIC CONDUCTIVE BODY

BACKGROUND OF THE INVENTION

1. Field of the Invention

The present invention relates in general to a display apparatus, more specifically, to a plasma display apparatus using a plasma display panel.

2. Description of the Related Art

A plasma display apparatus using a plasma display panel (hereinafter referred to as "PDP") as a display apparatus employs an electromagnetic shield as a measure against electromagnetic interference (EMI) so that unnecessary electromagnetic waves (hereinafter referred to as "unnecessary radiation") do not leak outside of the apparatus. An electromagnetic wave emitted from the front surface (display surface) of the PDP is shielded by a conductive layer (hereinafter referred to as "electromagnetic shield") installed at a light-permeable optical filter on the front surface of the PDP. For the purpose of reducing unnecessary radiation, Japanese Patent Laid-Open Publication Nos. 2004-45778 and 2004-170624 disclosed a new scheme for attaching an optical filter that has the aforementioned electromagnetic shield to a plasma display apparatus.

Along with a severe decline in price of PDPs in recent years, a number of PDP manufactures are faced with cutting down their official retailing prices of PDPs. One way to do that is employing a low-price optical filter in replacement of the optical filter equipped with the electromagnetic shield. In general, there are two types of electromagnetic shields: mesh-type electromagnetic shields having conductive metal mesh patterns and transparent conductive film type electromagnetic shields formed by sputtering. The mesh type electromagnetic shields have a surface resistance not higher than 0.1 $\Omega$/square, for example, as described in Table 1 of Japanese Patent Laid-Open Publication No. 2004-221565. On the other hand, the transparent conductive film type electromagnetic shields have a surface resistance not higher than 1.0-2.0 $\Omega$/square as described in Table 3 of Japanese Patent Laid-Open Publication No. 2004-264350.

In the light of the aim of reducing unnecessary radiation, the mesh type electromagnetic shield having a smaller surface resistance is desired. Unfortunately however, the mesh type electromagnetic shield is usually very expensive compared with the transparent conductive film formed by sputtering because an etching process should be carried out for the formation of a metal mesh.

Despite the advantage of cost-effectiveness, the transparent conductive film is still inadequate in some cases for satisfactorily reducing unnecessary radiation due to its relatively high surface resistance. In case of using an optical filter including an electromagnetic shield with a relatively high surface resistance, reducing unnecessary radiation at a satisfactory level becomes very important. However, the above-described conventional technologies do not suggest any fully satisfactory method for reducing unnecessary radiation using a low-price optical filter with a relatively high surface resistance (for example, an optical filter having the transparent conductive film type electromagnetic shield).

SUMMARY OF THE INVENTION

It is, therefore, an object of the present invention to provide a technique for reducing unnecessary radiation in a cost-effective way.

To achieve the above objects and advantages, there is provided a plasma display panel which includes an optical filter having an electromagnetic shield, a conductive rear surface cover covering the rear surface of a PDP, and a conductive body having elasticity interposed between the optical filter and the rear surface cover for electric connection therebetween. Also, by compressively inserting the elastic conductive body into plural bosses electrically connected to the rear surface cover, connection resistances (between the optical filter and the elastic conductive body, and between the rear surface cover and the elastic conductive body) can be reduced.

As such, because unnecessary radiation from the PDP obtained by the electromagnetic shield of the optical filter is flown (leaks) to an earth side (i.e., rear surface cover), even a transparent conductive film type whose surface resistance is relatively high (not lower than 0.5 $\Omega$/square) can be advantageously used as a electromagnetic shield for reducing unnecessary radiation.

A plurality of bosses are formed in the filter fixing members which have a case shape and are electrically connected to the rear surface cover formed to encompass the periphery of the PDP. Preferably, the elastic conductive body is a gasket.

In this manner, all unnecessary radiation can be fully reduced in a cost-effective way.

BRIEF DESCRIPTION OF THE DRAWINGS

The above aspects and features of the present invention will be more apparent by describing certain embodiments of the present invention with reference to the accompanying drawings, in which.

DETAILED DESCRIPTION OF THE PREFERRED EMBODIMENTS

Figure 1:
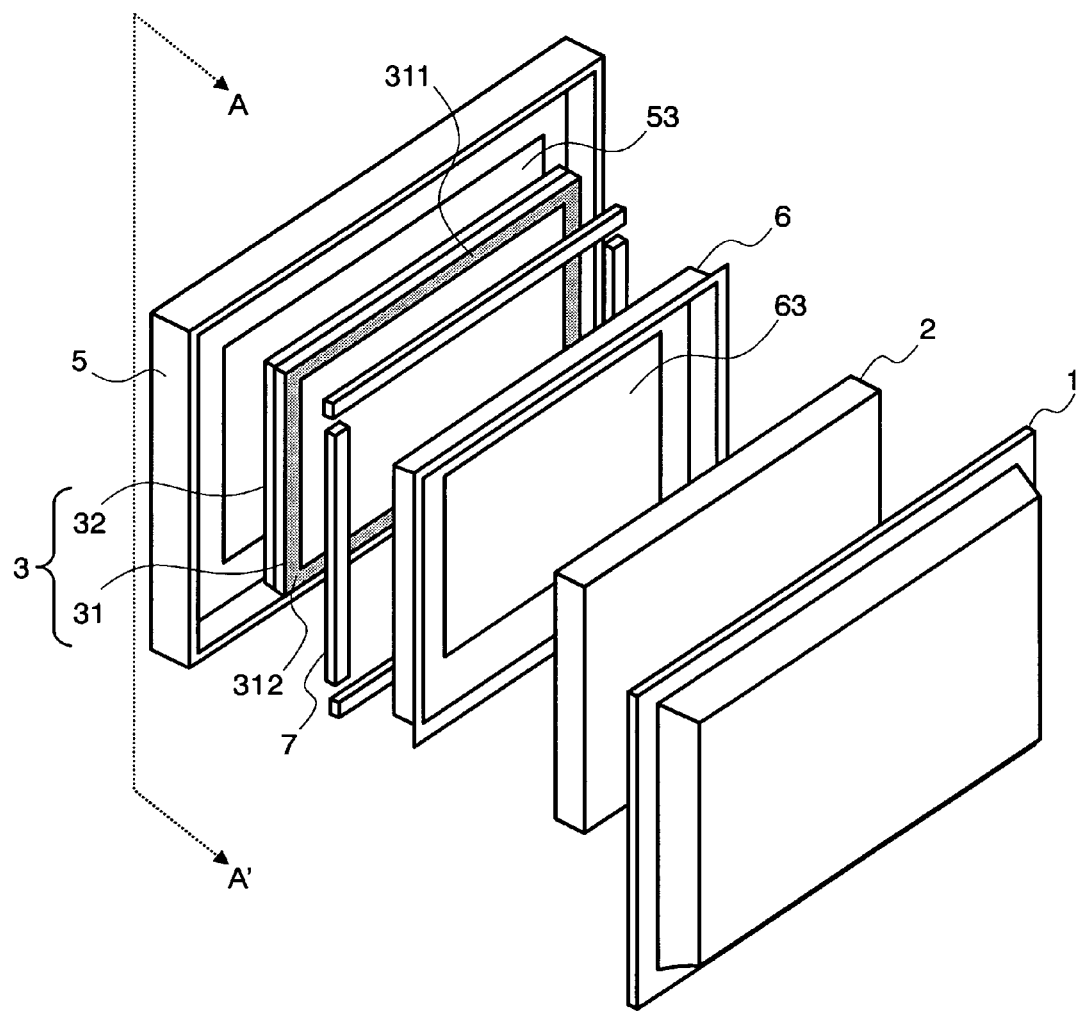
FIG. 1 is an exploded perspective view of main parts of a plasma display apparatus in accordance with the present invention.

A preferred embodiment of the present invention will be described herein below with reference to the accompanying drawings. To facilitate explanation, like components are designated by the same reference numerals, and therefore the explanation of those components will be omitted hereafter.

Embodiment 1

Figure 2:
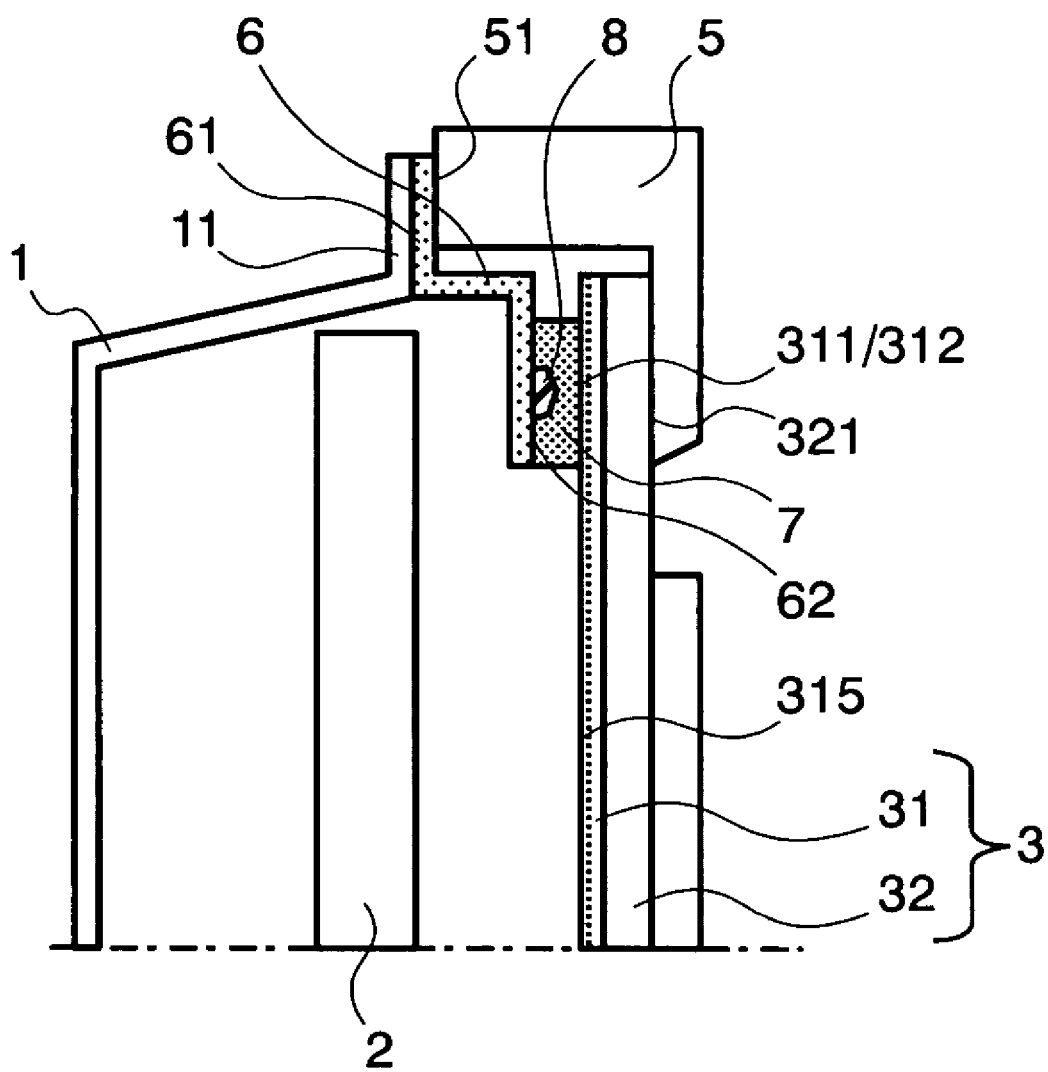
FIG. 2 is a partial, cross sectional view of main parts of a plasma display apparatus, in accordance with a first embodiment of the present invention.

FIG. 1 is an exploded perspective view of main parts of a plasma display apparatus in accordance with the present invention, and FIG. 2 is a partial, cross sectional view of main parts of a plasma display apparatus according to a first embodiment of the present invention, taken along line A-A' of FIG. 1. To be more specific, FIG. 2 only shows the upper part, while the lower part is omitted.

First, the constitution of a plasma display apparatus will be explained with reference to FIG. 1. As shown in FIG. 1, an optical filter 3 having a spherical shape almost similar to the PDP is disposed at the front surface side (viewer's side) of the PDP 2. The optical filter 3 is formed by interposing an adhesive layer (not shown) between an optical filter member 31 having an electromagnetic shield (not shown) capable of shielding electromagnetic waves and a glass substrate 32 made of transmitting materials.

Electromagnetic shields are largely divided into two types. One is a mesh type electromagnetic shield having a conductive mesh pattern with a grid-shaped opening, and the other is a transparent conductive film type electromagnetic shield formed by sputtering. The mesh type electromagnetic shield can be classified into two groups according to its manufacturing method. One is a conductive mesh whose mesh pattern is formed by printing conductive paste, e.g., plating, or by exposing/developing a silver salt-containing layer (hereinafter, this mesh is generically referred to as "metal mesh"), and the other is a fiber mesh whose mesh pattern is formed by plating the surface of a nonwoven fabric, e.g., polyester.

The surface resistance of the metal mesh type optical filter is not higher than 0.1 Ω/square, and the surface resistance of the fiber mesh type optical filter is in the range of 0.5 to 1 Ω/square. Meanwhile, the surface resistance of the transparent conductive film type optical filter is in the range of 1.0 to 2.0 Ω/square, which is greater than the other two. As mentioned before, the transparent conductive type optical filters are less costly than the mesh type optical filters. In addition, in the case of the fiber mesh type optical filters, since a metal plating is coated onto fiber, they are less expensive than the metal mesh type optical filters but more expensive than the transparent conductive film type optical filters. Therefore, the inventors decided to use the transparent conductive film type optical filter as an electromagnetic shielding optical filter of the present invention. However, it should be noted that the scope of the present invention is not limited thereby, and the fiber mesh type optical filter or the metal mesh type optical filter may also be used if desired.

Moreover, in the end portion 311 of the periphery on the PDP side of the optical filter member 31, an electrode 312 of the electromagnetic shield (not shown) is formed along the side of the periphery. Meanwhile, a front case 5, that is, the front side case made of resin materials, which has an opening 53 for transmitting an image light from the PDP 2 is arranged on the front surface side of the optical filter 3. In addition, a fixing member 6 having an opening 63 for transmitting an image light from the PDP is deposited on the PDP side of the optical filter 3. The fixing member 6 has a spherical shape, a case shape to be more specific, so that it may encompass the circumference of the PDP. And, a conductive gasket 7, which is an elastic conductor, is disposed between the optical filter 3 and the fixing member 6 along the electrode 312 formed on the periphery of the optical filter 3, so as to electrically connect the electrode 312 of the optical filter 3 with the fixing member 6. The conductive gasket 7 is an elastic body with good conductivity and is prepared by coating the surface of a foaming agent of the substrate with a metal fiber non-woven fabric for example. When compressed, the gasket 7 generates a repulsive force exhibiting a spring-like property, and therefore improves electric connection towards the contact surface of the fixing member 6 or the optical filter 3. The front case 5 and the fixing member 6 are for retaining or fixing the optical filter 3 at its peripheral portion. The rear surface of the PDP 2 is coated with a rear surface cover 1 made of conductive metals (e.g., aluminum) for shielding electromagnetic waves.

Referring to FIG. 2, the following will now explain the constitution of a shield case shielding unnecessary radiation from the PDP 2. The intensity of unnecessary radiation emitted from a case of an electric appliance, e.g., a plasma display apparatus, is regulated in Japan for example by the VCCI (Voluntary Control Council for Interference by data processing equipment electronic office machine) or in America by the FCC (Federal Communication Commission). The constitution of a present invention embodiment not only employs the low-price optical filter described above but also satisfies the regulations (especially, the FCC which is stricter than the VCCI).

In the plasma display apparatus assembled from the components shown in FIG. 1, an end portion 321 of the periphery on the front surface side optical filter 3 is connected to the front case 5, as shown in FIG. 2. Meanwhile, the end portion 311 of the periphery on the opposite PDP 2 side is retained, being pressed by the fixing member 6 with the interposed conductive gasket 7. The conductive gasket 7 is sandwiched between the optical filter 3 and the fixing member 6 on the end portion 311 of the optical filter 3 provided with the electrode 312 of the electromagnetic shield 315. Thus, the electromagnetic shield 315 is electrically connected to the fixing member 6 by the electrode 312 and the conductive gasket 7 interposed therebetween. Moreover, a flat portion 61 on the periphery of the fixing member 6 and the rear surface cover 1 are secured to a flat portion 51 on the periphery of the front case 5 with a screw (not shown) for example.

The PDP 2 is supported to the rear surface cover 1 with a support means (not shown), and as described above, the rear surface cover 1, or a flat portion 11 on its periphery and the fixing member 6 are secured to the front case 5 with a screw (not shown) for example.

The shield case thusly constituted makes it possible to reduce unnecessary radiation from the PDP 2 since the PDP 2 is disposed within an equipotential surface (electromagnetic shield) encompassed by the optical filter's electromagnetic shield 315 and electrode 312, the conductive gasket 7, the fixing member 6, the rear surface cover 1.

The rear surface cover 1 and the electromagnetic shield 315 of the optical filter have stable, low resistances. However, it is difficult to secure low, stable resistances between the rear surface cover 1 and the fixing member 6, between the fixing member 6 and the conductive gasket 7, or between the conductive gasket 7 and the optical filter 3 because these make electrical surface contact with each other. In particular, in case of employing the transparent conductive film type optical filter as in the present embodiment, its surface resistance increases to 1-2 Ω/square, compared with the metal mesh type optical filter (whose surface resistance is not higher than 0.1 Ω/square). Consequently, the electrical connection resistance (hereinafter referred to simply as "connection resistance") connecting between the rear surface cover 1 and the optical filter is increased. Because the influence of the connection resistance becomes greater with an increasing surface resistance, unnecessary radiation exceeding the limit regulated by the FCC for example may be emitted. In line with this, the inventors discovered that the influence of an unbalanced connection resistance is great between the fixing member 6 and the conductive gasket 7 and between the conductive gasket 7 and the optical filter 3. This is because the contact surface between the rear surface cover and the conductive gasket undergoes mechanical deformation, that is, it may be bent or flexed or screwed up, so that the electric connection on a certain part between the conductive gasket and the contact surface becomes unstable. Therefore, although the transparent conductive film type optical filter having a relatively large surface resistance may be employed, it becomes easy to reduce unnecessary radiation simply by reducing the contact resistance.

In this embodiment, as shown in FIG. 2, a plurality of bosses (convex projections) 8 are formed on compressing units 62 compressing the conductive gasket 7 of the fixing member 6. When a part of the conductive gasket 7 is compressed by the bosses 8, the connection resistance can be lowered.

Figure 3:
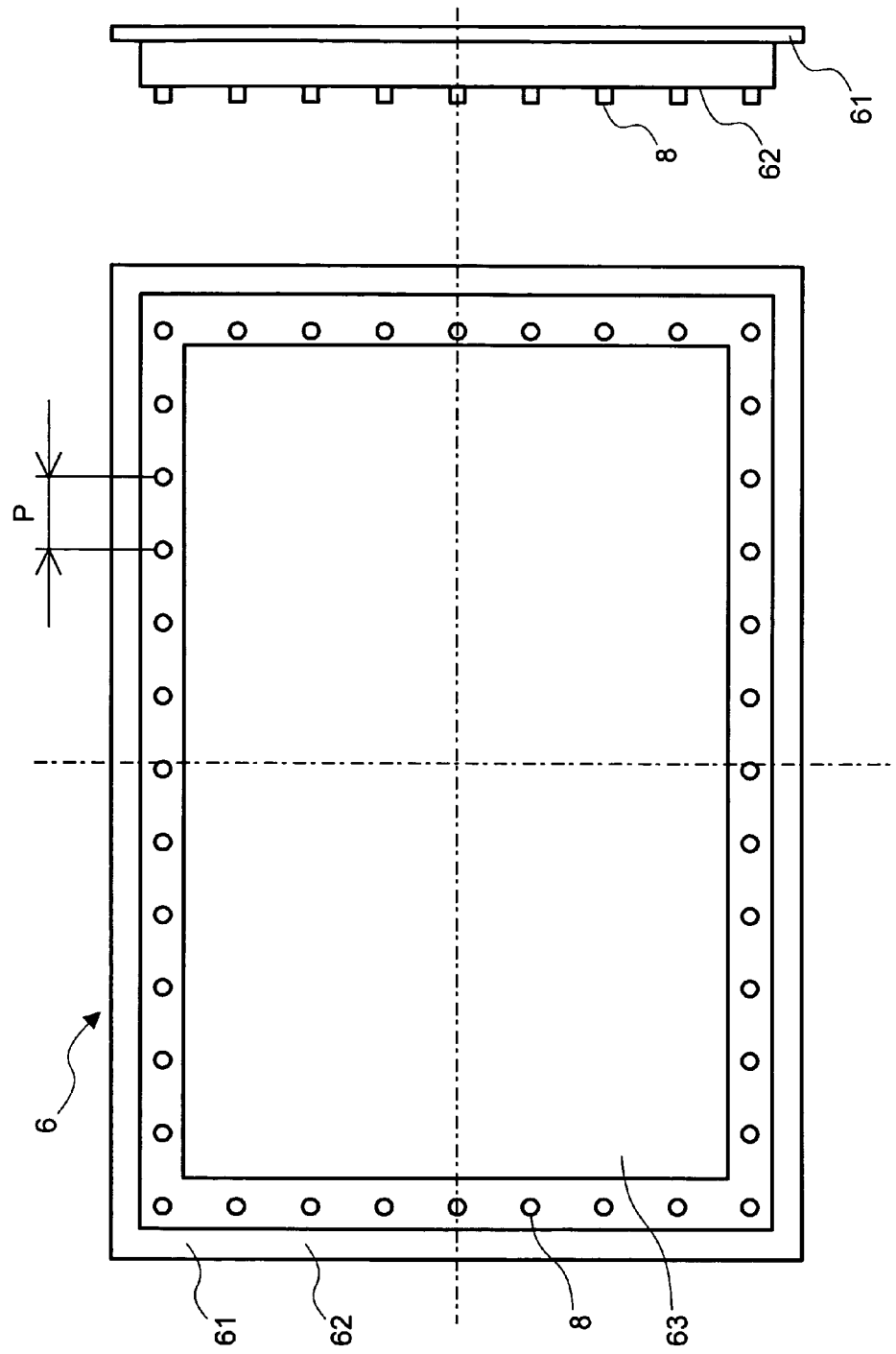
FIG. 3 is a diagram showing the arrangement of bosses formed in a fixing member, in accordance with the first embodiment of the present invention.

FIG. 3 shows the arrangement of bosses 8 formed on the fixing member. The left side of the drawing is a front view of the fixing member seen from the optical filter side, and the right side of the drawing is a right side view of the fixing member. As depicted in FIG. 3, the bosses 8 are arranged on the compressing units 62, being almost in parallel with the openings 63 (the spherical shape of the opening 63 is almost the same as the PDP) of the fixing member 6, at a predetermined distance P apart from each other, and the overall configuration of the bosses 8 is almost spherical. Even though FIG. 3 illustrates the bosses 8 aligned in parallel with each side, more than two rows of bosses can also be formed. In such case, it is desired to arrange the bosses 8 in zigzag form, that is, rows of bosses are formed alternately, to reduce unnecessary radiation.

Figure 5:
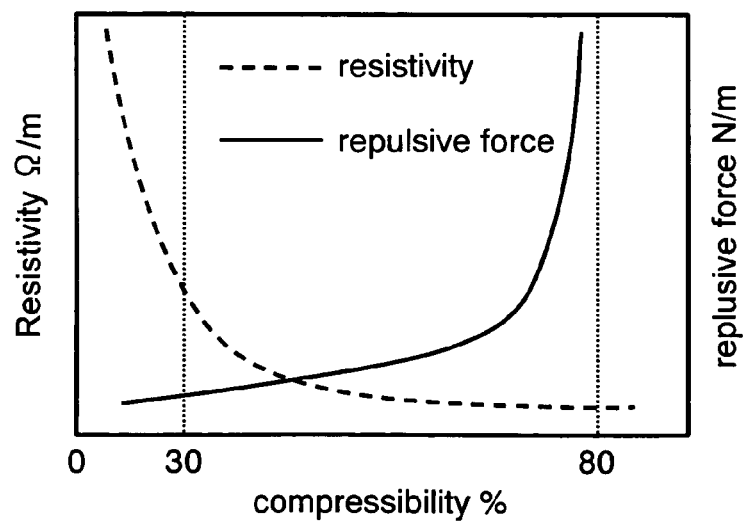
FIG. 5 is a graph showing the relation between resistivity and repulsive force and compressibility of the conductive gasket.

Although more details will be followed with reference to FIG. 5, a predetermined compression force needs to be applied to the conductive gasket in order to reduce the surface contact resistance (connection resistance) between the fixing member coming in contact with the conductive gasket and the electrode of the optical filter. As in conventional technologies, if the surfaces of the compressing units 62 without bosses 8 of the fixing member 6, which compress the conductive gasket 7 toward the optical filter 3 are not flat, it is difficult to impress a predetermined compression force to the conductive gasket. In such case, electric connection between the fixing member 6 and the conductive gasket 7 and between the conductive gasket 7 and the optical filter becomes incomplete, leading to an increase in the connection resistance, resultantly causing unnecessary radiation from the incomplete portions.

According to the present embodiment, a plurality of bosses 8 are arranged in a spherical shape overall at a predetermined distance P apart from each other on the compressing units 62 of the fixing member 6, correspondingly to the end portion 311 of the periphery where the electrode 312 of the optical filter 3 is installed. And, the length of the boss 8 (degree of convexed state) (a) is set to be larger than the deformation amount (hereinafter referred to as "estimated deformation") in a concave shape caused by distortion, bending or mechanical deformation of the compressing units of the conventional fixing member. In general, the fixing member for use in a 42-inch plasma display apparatus is bent (estimated deformation (b)) within the allowance ±1 mm, typically, ±0.5 mm. That is, the bosses 8 are formed to satisfy the condition a>b=0.5 mm.

When the condition is met, although the compressing units of the fixing member may be bent or flexed in a concave shape for example, since the bosses 8 offset that, a predetermined compression force can be applied to the conductive gasket. This means that the connection resistance between the fixing member and the optical filter can be reduced satisfactorily by sufficiently pressing the conductive gasket 7 toward the optical filter with the bosses 8.

In other words, as the plural bosses of the embodiment absorb flexures (concave-shaped areas) and permit the multipoint contact, the connection resistance between the fixing member and the optical filter can be reduced satisfactorily. Consequently, this makes it possible to electrically connect the optical filter and the rear surface cover with a low resistance, and to fully reduce unnecessary radiation by employing the low-price transparent conductive film type optical filter.

Although the bosses 8 are formed on the fixing member 6 according to this embodiment, they may not come in direct contact with the optical filter 3 by interposing the conductive gasket 7 therebetween. For instance, even in the case that an optical filter is attached to a glass substrate as in this embodiment, it is possible to prevent any damages on the bosses 8.

From the viewpoint of reducing unnecessary radiation, the gap P between two neighboring bosses should not be greater than ¼ of the wavelength of a maximum frequency (1 GHz) regulated in unnecessary radiation. More desirably, it satisfies the following condition:

$P<\lambda/6$ (wherein, $\lambda=5$ cm, provided that the speed of light $(C)$ of 1 GHz wavelength is $3\times10^8$ m.)   Formula I In this embodiment, the gap P between bosses 8 is set to 1.5-4 cm. If Formula I is taken into consideration, the gap P should be as small as possible. However, if the gap I is smaller than 1.5 cm, the conductive gasket between bosses cannot easily contact the compressing units 62 of the fixing member 6. For this reason, it is more desirable to set the gap P in the range of 2 to 3 cm.

The conductive gasket has a spring-like property (i.e., elasticity), and needs to be pressurized for satisfactory electric connection. Therefore, in order to reduce the connection resistance between the fixing member 6 and the optical filter 3 having the interposed conductive gasket therebetween, the inventors carefully examined the thickness of the conductive gasket 7, the length (degree of convexed state) of the bosses 8 and the structural gap between the optical filter 3 and the fixing member 6 and discovered the following relation among them. The relationship will be explained in more detail, referring to FIGS. 4 and 5.

To check the relationship, electromagnetic waves generated by a current flowing from the rear surface cover side to the rear surface cover, in the fixing member connected to the optical filter, and in tens of metal screws (not shown) used for fixing the front case are measured, respectively. Comparing frequencies thereof with frequencies with the unnecessary radiation problem, one can easily check the relationship.

Figure 4:
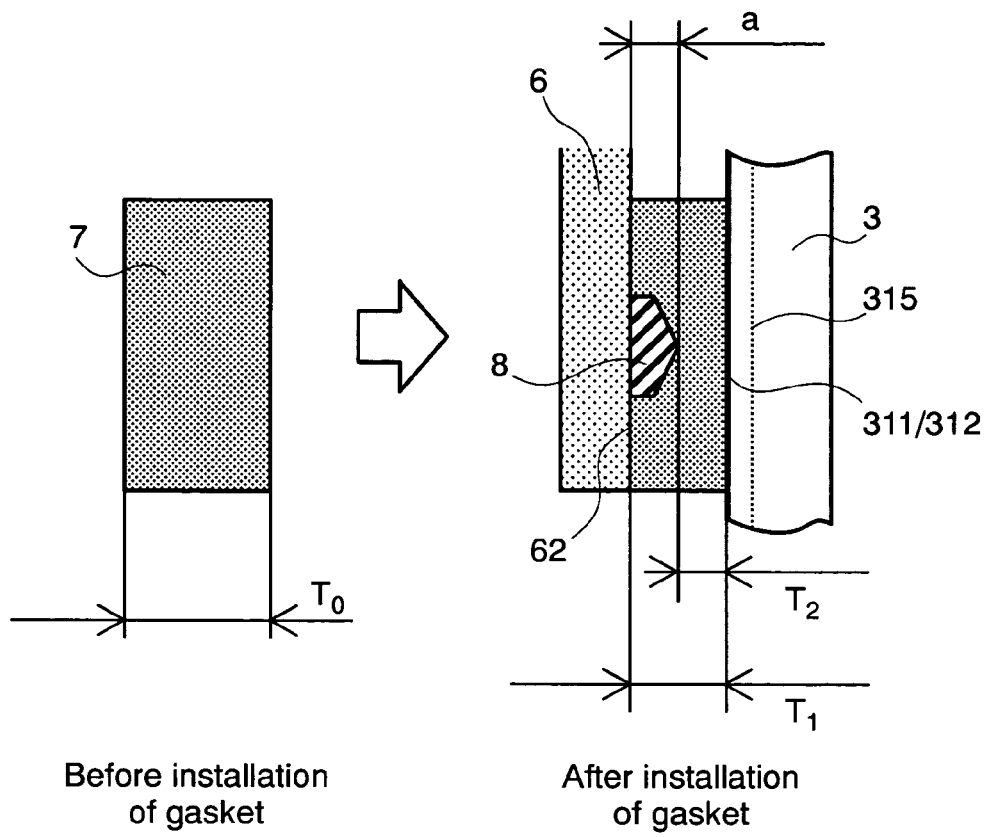
FIG. 4 is a partial, detailed sectional view around a conductive gasket portion, in accordance with the first embodiment of the present invention.

FIG. 4 is a partial, detailed sectional view around the conductive gasket portion in FIG. 2. The left side of FIG. 4 illustrates a status before proceeding to installation of the conductive gasket, while the right side of FIG. 4 illustrates a status after the conductive gasket is installed. In addition, FIG. 5 is a graph showing the characteristic relation between resistivity and repulsive force and compressibility of the conductive gasket. In FIG. 5, the horizontal axis indicates compressibility (%) of the conductive gasket, the vertical axis on the left side indicates resistivity ($\Omega/m$), and the vertical axis on the right side indicates repulsive force per unit length (N/m). Here, resistance refers to the connection resistance (surface contact resistance) between the fixing member and the conductive gasket, and the connection resistance (surface contact resistance) between the conductive gasket and the optical filter.

Referring back to FIG. 4, $T_0$ (mm) denotes a thickness of the conductive gasket in non-compressed status before installation, $T_1$ (mm) denotes a thickness of the conductive gasket after installation, having been compressed by the fixing member 6 without bosses 8 mounted on the optical filter 3, $T_2$ (mm) denotes a thickness of the installed conductive gasket after installation, having been compressed by the fixing member 6 with bosses 8 mounted on the optical filter 3, and a (mm) denotes the amount of convexed state of the boss 8 of the fixing member 6. In addition, $K_1$ (%) denotes compressibility of the conductive gasket in an area where no boss 8 is formed in the fixing member 6, and $K_2$ (%) denotes compressibility of the conductive gasket in an area where bosses 8 are formed in the fixing member 6. As described before, the amount of convexed state (a) of the boss 8 is greater than the estimated deformation (b) (mm) of the compressing units of the fixing member. Moreover, $T_1$ is equal to the gap between the optical filter 3 and the fixing member 6.

To be short, the compressibilities $K_1$ and $K_2$ and $T_1$, $T_2$ and a satisfy the conditions expressed in Formula II below:

$$K_1 = (T_0 - T_1)/T_0 \times 100$$

$$K_2 = (T_0 - T_2)/T_0 \times 100$$

$$a = T_1 - T_2 \qquad \text{Formula II}$$

Meanwhile, as evident from the compressibility property of the conductive gasket shown in FIG. 5, a 30% or greater compressibility needs to be imparted to the conductive gasket so as to obtain a stable resistivity. However, if an 80% or greater compression force is applied to the conductive gasket, its repulsive force is sharply increased. That is to say, a desirable compressibility of the conductive gasket falls within the range of 30 to 80%. This range may vary, though, according to the conductive gasket's material, thickness and the like.

Suppose that $K_1 = 40\%$ and $K_2 = 70\%$. Then, even though the thicknesses ($T_1$ and $T_2$) of the conductive gasket may be deviated from ±15% for example, by assembly tolerance, one of $K_1$ and $K_2$ must be within the range of 30-80% to obtain good connection resistance (contact resistance) and shield unnecessary radiation of electromagnetic waves from a stable case. That is, the conditions expressed in Formulas IV and V for $K_1$, $K_2$, a and $T_0$ can be derived from Formula III:

$$K_1 < K_2,$$

$$K_1 > 30\%$$

$$K_2 < 80\%$$

$$b < a \qquad \text{Formula III}$$

$$1 < K_1/K_2 < 2.66 = 80/30 \qquad \text{Formula IV}$$

$$b < a < 0.5 \times T_0 \qquad \text{Formula V}$$

Formula IV shows the ratio of compressibilities of the conductive gasket, and Formula V shows the relation between the thickness ($T_0$) of the conductive gasket before installation and the amount of convexed state of bosses formed in the fixing member. Formula V is derived from Formulas III and IV. To attain the function of shielding unnecessary radiation of electromagnetic waves from a stable case, all the conditions should be met.

In this embodiment, it was assumed that the conductive gasket in its non-compressed state has a spherical cross section, $T_0$ of 3 mm, and width of 10 mm. Further, the amount of convexed state (a) of the bosses 8 formed in the fixing member 6 is in the range of 1-1.5 mm, and the thickness ($T_1$) of the conductive gasket was set to approximately 2 mm ($K_1 \cong 30\%$). Then, unnecessary radiation in the 42-inch plasma display apparatus was measured with the transparent conductive film type optical filter. It turned out that the intensity of unnecessary radiation satisfied the FCC regulations. Also, a lower limit (1 mm in this case) of the amount of convexed state (a) for the boss 8 is set based on the manufacturing allowance of the fixing member 6, while an upper limit (1.5 mm in this case) is set to $0.5 \times T_0$. A desired value of the amount of convexed state of the boss 8 is close to the midpoint between upper and lower limits, that is, about 1.2 mm.

Although the transparent conductive film type optical filter having surface resistance of 1-2 Ω/square was employed as the optical filter of this embodiment, the present invention is not limited thereto. In effect, the present invention is also applicable to a fiber mesh type optical filter having surface resistance of 0.5-1 Ω/square or a metal mesh type optical filter having surface resistance not higher than 0.1 Ω/square. Particularly, the plasma display apparatus of the present invention can be very advantageously used with an optical filter having surface resistance of 0.5 Ω/square or above.

To increase the efficiency of a PDP cell, concentration of xenon gas filled in the PDP is expected to go up. When the concentration of xenon gas increases, driving voltage is usually increased and unnecessary radiation from the PDP increases. In such case, therefore, the electromagnetic shielding function for reducing unnecessary radiation greater than what is required at present becomes essential. At this time, it may be difficult to clear the regulation on unnecessary radiation even when a metal mesh type optical filter is used. The benefit of the present invention is that it can provide a means for solving this problem at low price.

In addition, according to this embodiment, the optical filter fixing member is prepared by compressing the electrode 312 forming surface on the electromagnetic shield 315 of the optical filter toward the fixing member 6 while interposing the conductive gasket 7 on the electrode 312 forming area, compressing the surface on the opposite side of the optical filter 3 toward the front case 5, and electrically connecting the fixing member 6 to the metallic rear surface cover 1. That is, the optical filter fixing means of this embodiment is constituted by the fixing member 6, the conductive gasket 7 and the front case 5.

Even if the bosses 8 according to this embodiment are arranged at the fixing member compressing the optical filter, the present invention is not limited thereto. For instance, the bosses may be formed on a flat portion connected to the rear surface cover or the fixing member, and the connection resistance between the rear surface cover and the fixing member may be lowered by interposing the conductive gasket therebetween.

Moreover, although the optical filter 3 according to this embodiment is sandwiched between the front case 5 and the fixing member 6 and the conductive gasket is interposed between the fixing member 6 and the optical filter 3, the present invention is not limited thereto. For instance, as shown in FIG. 1 of Japanese Patent Laid-Open Publication No. 2004-45778, the optical filter may be sandwiched between a flat portion (flange portion) on the periphery of the rear surface cover and the front case, and the conductive gasket may be interposed between the rear surface cover and the optical filter. By forming bosses related to this embodiment on the flat portion 11 (flange portion) on the periphery of the rear surface cover, it becomes possible to improve the effectiveness of shielding electromagnetic interference. This corresponds to a case where the fixing member of the embodiment is combinely used in the flat portion 11 (flange portion) of the rear surface cover 1.

Also, in such case, the optical filter fixing member is constituted by a rear surface cover, a conductive gasket 7, and a front case.

Embodiment 2

Figure 6:
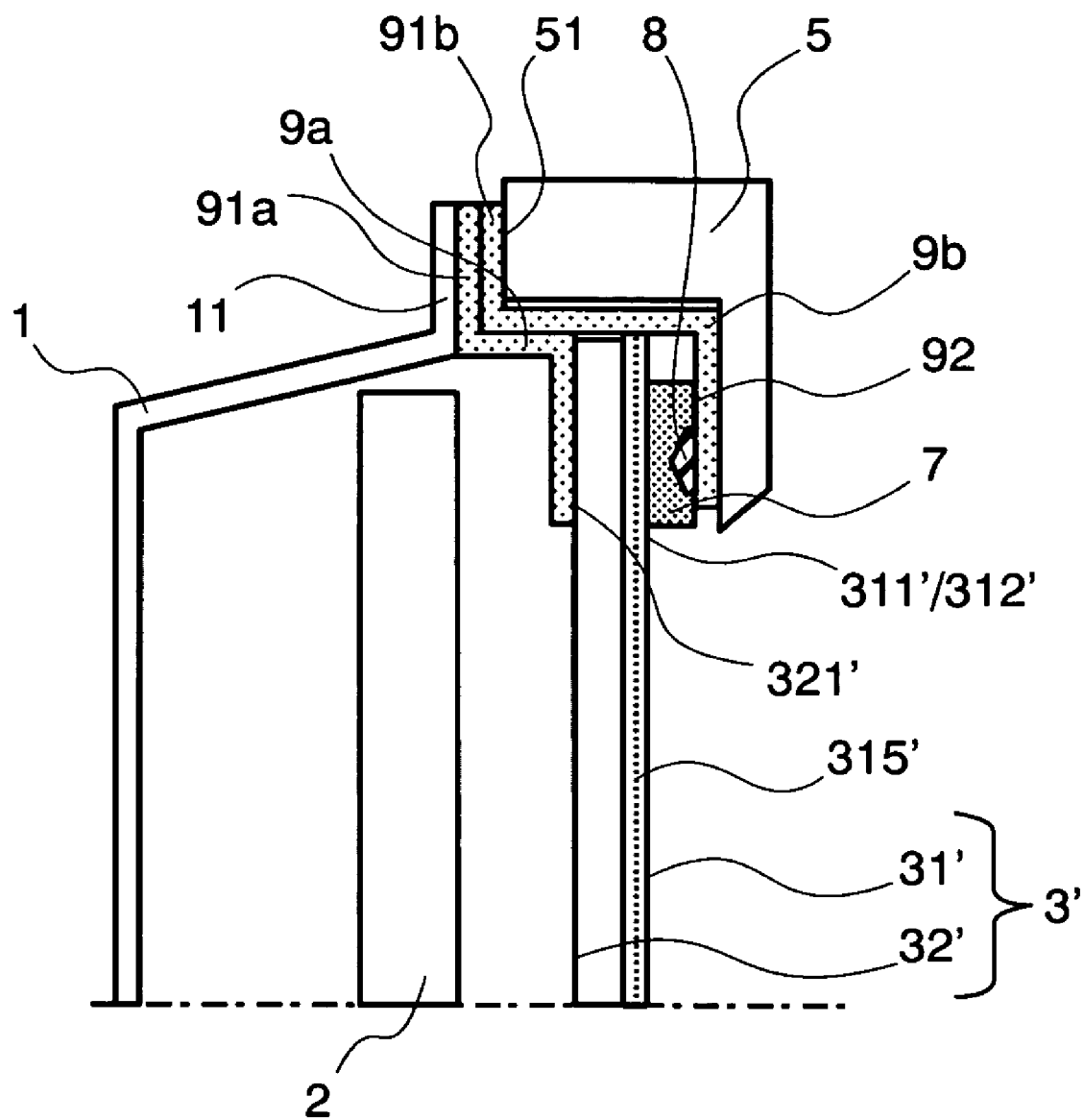
FIG. 6 is a partial, cross sectional view showing main parts of a plasma display apparatus, in accordance with a second embodiment of the present invention.

The optical filter employed in the embodiment 1 had the electrode of the electromagnetic shield on the surface of the PDP side, but it can also be installed at the front case side (viewer's side). FIG. 6 is a partial, cross sectional view showing main parts of a plasma display apparatus according to a second embodiment of the present invention, in which the electrode of the electromagnetic shield is installed at the front case side.

As shown in FIG. 6, a transparent conductive film type optical filter 3' comprises an optical filter member 31' and a glass substrate 32; corresponding to member 31 and substrate 32 of the first embodiment, and includes an electrode 312' of an electromagnetic shield 315' on the front case 5 side at an end portion 311' of the periphery thereof. The rear surface side (PDP side) and front surface side of the optical filter 3' include a first fixing member 9a and a second fixing member 9b for retaining/fixing the optical filter. Both the first fixing member 9a and the second fixing member 9b have openings (not shown) through which an image light emitted from the PDP passes. An end portion 321' of the periphery on the rear surface side (PDP side) of the optical filter 3' is connected to the first fixing member 9a, and the end potion 311' of the periphery on the opposite front surface side is retained, being compressed by the second fixing member 9b with an interposed conductive gasket 7. Also, the second fixing member 9b is connected to the front case 5. The conductive gasket 7 is sandwiched between the optical filter 3' and the second fixing member 9b on the end portion 311' of the optical filter 3' provided with the electrode 312' of the electromagnetic shield 315'. Thus, the electromagnetic shield 315' is electrically connected to the second fixing member 9b by the electrode 312' and the conductive gasket 7 interposed therebetween. Moreover, flat portions 91a and 91b on the periphery of the first and second fixing members 9a and 9b and the rear surface cover 1 are secured to a flat portion 51 on the periphery of the front case 5 with a screw (not shown) for example.

In the meantime, the second fixing member 9b includes a plurality of bosses 8 arranged on compressing units 92 compressing the conductive gasket 7. These bosses 8 are arranged almost in parallel with openings 63 (not shown) of the second fixing member 9b at a predetermined distance P apart from each other, and the overall configuration of the bosses 8 is almost spherical. Even though a concave flexure for example may be formed in the compressing units 92 of the second fixing member 9b, it is possible to apply a predetermined compression force to the conductive gasket by setting the amount of convexed state of the bosses 8 to be greater than the flexure and therefore, to reduce the connection resistance between the second fixing member 9b and the optical filter at a satisfactory level.

The shield case thusly constituted makes it possible to reduce unnecessary radiation from the PDP 2 since the PDP 2 is disposed within an equipotential surface (electromagnetic shield) encompassed by the optical filter's electromagnetic shield 315' and electrode 312', the conductive gasket 7, the second fixing member 9b, and the rear surface cover 1.

An optical filter fixing means in this embodiment is constituted by the first fixing member 9a, the conductive gasket 7, the second fixing member 9b, and the front case 5.

Moreover, in this embodiment, it is possible to make the front case 5 from metals (e.g., aluminum), form the bosses 8 in the metallic front case, and combinedly use the second fixing member with the front case.

In recent technologies, a film type optical filter member is sometimes directly attached to the PDP. Again, the present invention can be very advantageously used by slightly modifying this embodiment.

As explained so far, according to the plasma display apparatus in the embodiment of the present invention, unnecessary radiation toward the front surface direction of the PDP is shielded by the optical filter having the electromagnetic shield, while unnecessary radiation toward the rear surface direction is shielded by the rear surface cover. Besides, according to the present invention, the bosses are used for reducing the connection resistance with the optical filter having the interposed conductive gasket. As such, the effectiveness of shielding electromagnetic interference can be improved even by employing a relatively low-price optical filter provided with an electromagnetic shield having surface resistance of 0.5 Ω/square or above. In other words, unnecessary radiation can be reduced satisfactorily in a cost-effective way.

Although the preferred embodiment of the present invention has been described, it will be understood by those skilled in the art that the present invention should not be limited to the described preferred embodiment, but various changes and modifications can be made within the spirit and scope of the present invention as defined by the appended claims.

What is claimed is:

1. A plasma display apparatus, comprising:
   a plasma display panel;
   a conductive rear surface cover covering a rear surface of the plasma display panel;
   an optical filter provided with a conductive layer having a surface resistance of 0.5 Ω/square or above, which is disposed at the front surface of the plasma display panel and serves to reduce leakage of electromagnetic waves from the plasma display panel;
   an optical filter fixing member electrically connected with the rear surface cover, for at least retaining the optical filter; and
   a conductive body having elasticity, which is interposed between the optical filter and the optical filter fixing member;
   wherein a plurality of bosses are formed in the optical filter fixing member, and a part of the elastic conductive body is compressed by the bosses, thereby electrically connecting an electric connection portion of the optical filter with the optical filter fixing member; and
   wherein $K_1$ (%) denotes compressibility of the elastic conductive body in an area where no bosses are formed in the fixing member, and $K_2$ (%) denotes compressibility of the elastic conductive body in an area where the bosses are formed in the fixing member, and a ratio of compressibility of $K_1$ and $K_2$ satisfy the following condition:

$1 < K_1/K_2 < 2.66$.

2. The plasma display apparatus of claim 1, wherein a thickness of the elastic conductive body before installation is about 3.0 mm, a gap between the conductive optical filter and the optical filter fixing member is about 2.0 mm, and a height of the boss is about 1.2 mm.

3. The plasma display apparatus of claim 1, wherein the elastic conductive body is a gasket.

4. The plasma display apparatus of claim 1, wherein a ratio of a height of the boss to a thickness of the elastic conductive body before installation is less than 0.5.

5. The plasma display apparatus of claim 1, wherein the optical filter fixing member reduces leakage of electromagnetic waves at least from a peripheral portion of the optical filter.

* * * * *